(12) United States Patent
Tsai et al.

(10) Patent No.: US 9,229,050 B2
(45) Date of Patent: Jan. 5, 2016

(54) BIST CIRCUIT FOR PHASE MEASUREMENT

(75) Inventors: Tsung-Hsien Tsai, Kaohsiung (TW);
Min-Shueh Yuan, Taipei (TW);
Chih-Hsien Chang, New Taipei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 741 days.

(21) Appl. No.: 13/205,722

(22) Filed: Aug. 9, 2011

(65) Prior Publication Data

US 2013/0038366 A1   Feb. 14, 2013

(51) Int. Cl.
*G01R 31/3187* (2006.01)
*G01R 31/30* (2006.01)
*G01R 31/317* (2006.01)

(52) U.S. Cl.
CPC ........ *G01R 31/3016* (2013.01); *G01R 31/3187* (2013.01); *G01R 31/31725* (2013.01); *G01R 31/31726* (2013.01); *G01R 31/31727* (2013.01)

(58) Field of Classification Search
CPC ............... G01R 31/3016; G01R 31/31725; G01R 31/31726; G01R 31/31727; G01R 31/3187
USPC .............................................. 327/2, 3, 7, 298
See application file for complete search history.

(56) References Cited

U.S. PATENT DOCUMENTS

| | | | | |
|---|---|---|---|---|
| 4,774,479 A | * | 9/1988 | Tateishi | 331/1 A |
| 7,042,971 B1 | * | 5/2006 | Flanagan et al. | 375/376 |
| 7,656,726 B2 | | 2/2010 | Cheng et al. | |
| 8,049,547 B2 | * | 11/2011 | Konishi | 327/291 |
| 2008/0303569 A1 | * | 12/2008 | Mai | 327/158 |
| 2011/0204949 A1 | * | 8/2011 | Ho et al. | 327/199 |

OTHER PUBLICATIONS

Mano et al., "Logic and Computer Design Fundamentals 2nd Edition Updated", 2001, Prentice-Hall, p. 190.*

* cited by examiner

*Primary Examiner* — Lincoln Donovan
*Assistant Examiner* — Colleen O Toole
(74) *Attorney, Agent, or Firm* — Duane Morris LLP

(57) ABSTRACT

A BIST circuit for high speed applications includes a phase difference detection circuit, a period-to-current conversion circuit having an input coupled to an output of the phase difference detection circuit and a current-to-voltage conversion circuit coupled to an output of the period-to-current conversion circuit. The phase difference detection circuit includes first NAND logic for receiving as inputs an input clock signal and a delayed version of an inverted version of the input clock signal; second NAND logic for receiving as inputs the inverted version of the input clock signal and a delayed version of the input clock signal; third NAND logic for receiving as inputs the input clock signal and the delayed version of the input clock signal; and fourth NAND logic for receiving as inputs the inverted version of the input clock signal and a delayed version of the inverted version of the input clock signal.

17 Claims, 8 Drawing Sheets

100

200

BIST CIRCUIT FOR PHASE MEASUREMENT

TECHNICAL FIELD

The present invention relates to clock signal phase measurement circuits and techniques, and more specifically to clock signal phase measurement circuits and techniques for high speed applications.

BACKGROUND

A Delay Locked Loop (DLL) is a digital circuit designed to support high-bandwidth data rates between devices. It provides zero propagation delay, low-clock skew between output clock signals throughout a device, and advanced clock domain control. The DLL is similar to a phase locked loop with the main difference being the absence of the voltage controlled oscillator. The DLL can be used to change the phase of a clock signal and can be viewed as a negative-delay gate in the path of the clock signal.

The typical DLL includes a delay chain composed of plural delay gates connected in series. The input of the chain is coupled to the clock that is to be delayed. A multiplexer is connected to each stage of the delay chain, and the selector of the multiplexer is automatically updated by a control circuit to produce the negative delay effect. The output of the DLL circuit is the negatively delayed clock signal. The DLL operates by comparing the phase of one of its outputs to the input clock to generate an error signal, which it then integrates and feeds back as the control signal to the delay elements within the DLL. The integration allows the error to go to zero while keeping the control signal where it needs to be for phase lock.

Conventional methods of testing the phase a DLL output vis a vis the source clock use a digital scope. A chip under test having a DLL is mounted on a PCB, and connected to a digital scope via cabling. Mismatches within the clock paths degrade the measurement accuracy when the operating frequency is in the gigahertz level and beyond. For this reason, some chips with DLL circuits are provided with on-chip measurements circuits. These on-chip measurements circuits convert a detected phase difference to a DC voltage value. This voltage value can then be read with a voltmeter. This approach addresses the above-described clock path matching problem of the PCB but suffers from its own problems. The conventional on-chip phase difference measurement circuit uses a XNOR gate, period-to-current converter and then current-to-voltage converter. The XNOR gate transforms the phase difference into a timing width using NMOS and PMOS transistors. One problem with this approach is that the duty cycle of the output period can be shifted due to process, voltage and temperature (PVT) corners. A second problem with this approach is that the synthesized frequency of the XNOR is not twice that of the input frequency due to limitations on the device speed. This makes the XNOR appropriate only for low frequency operation less than 100 MHz.

Improved DLL measurements techniques for high speed applications and devices are desired.

BRIEF DESCRIPTION OF THE DRAWINGS

The accompanying drawings illustrate preferred embodiments of the disclosed measurement circuits and techniques, as well as other information pertinent to the disclosure, in which.

DETAILED DESCRIPTION

This description of the exemplary embodiments is intended to be read in connection with the accompanying drawings, which are to be considered part of the entire written description. In the description, terms concerning coupling and the like, such as "coupled", "connected" and "interconnected," refer to a relationship wherein structures communicate with one another either directly or indirectly through intervening structures unless expressly described otherwise.

Figure 1:
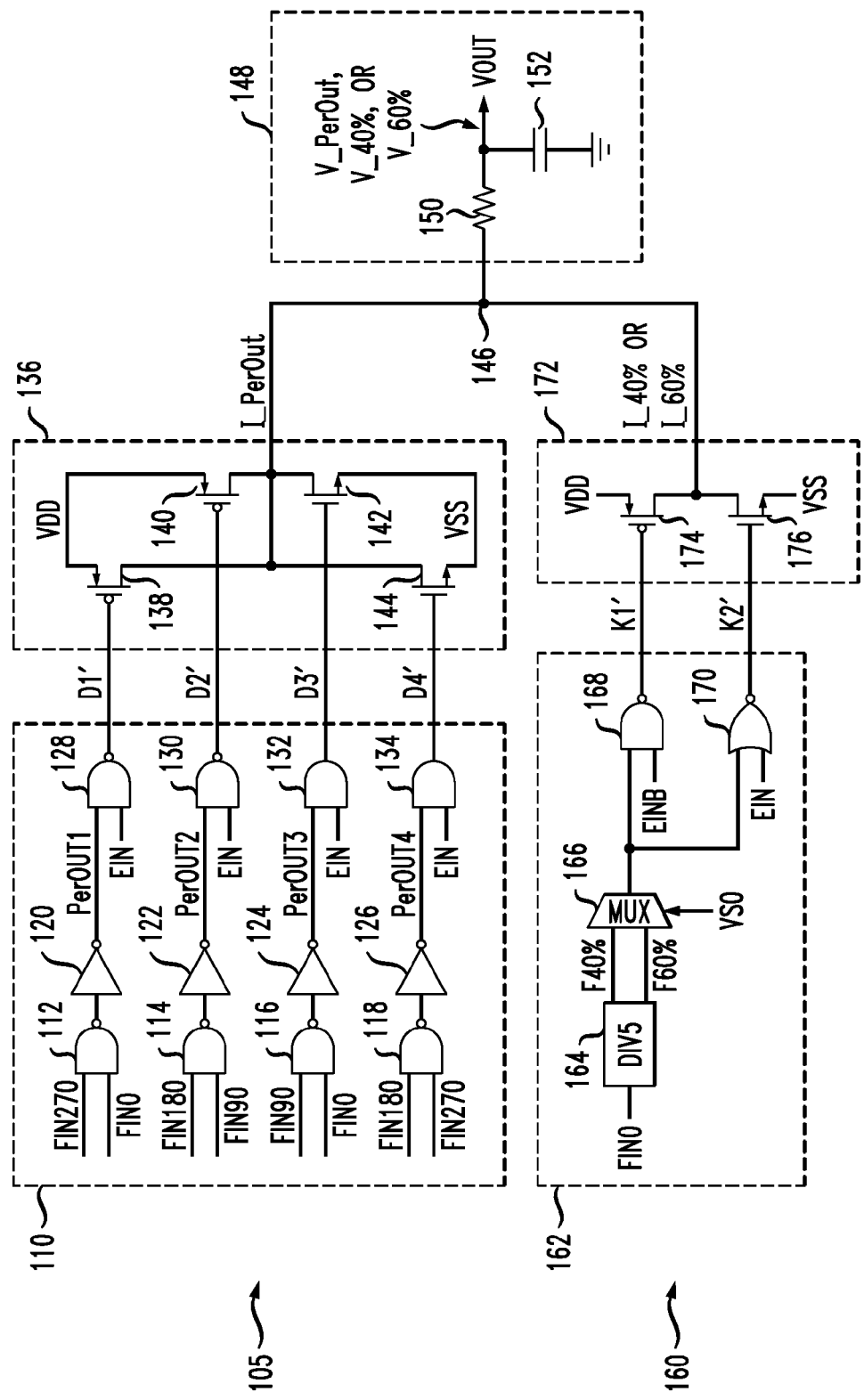
FIG. 1 illustrates an embodiment of a built-in-self-test (BIST) measurement circuit for measuring the phase difference between a source clock and a phase delayed version of the source clock.

FIG. 1 illustrates an embodiment of a DLL built-in-self-test (BIST) measurement circuit 100 for measuring phase difference between a source clock and a phase delayed version of the clock. The measurement circuit 100 includes a phase difference measurement section 105 and a reference section 160. The phase difference measurement section 105 is described first in connection with FIGS. 1-5, followed by a description of the reference section 160 in connection with FIGS. 1 and 6 to 7.

The phase difference measurement section 105 includes a phase-difference to-period converter circuit 110, a period-to-current converter circuit 136 and a current-to-voltage converter circuit 148 all connected in series. The phase-difference-to-period converter circuit 110 includes four NAND gates 112, 114, 116 and 118 having output connected to respective inverters 120, 122, 124, 126. It should be understood that together the NAND gates and inventers provide an AND logic function but this AND function is split into the illustrated combination for performance considerations. Signals FIN0 and FIN180 represent a first pair of differential clock signals (i.e., FIN180 is the inversion of FIN0) and FIN90 and FIN270 represent a pair of delayed differential clock signals having target phases 90 and 270 degrees. NAND gate 112 receives input signals FIN 270 and FIN0. The NAND gate 112 operates to provide a signal that is representative of the phase difference between its input signals. Specifically, the output of the NAND gate 112 is logic low only when both FIN0 and FIN 270 are logic high and otherwise the output is logic high. Inverter 120 inverts the output of NAND 112 so that signal PerOUT1 is logic high only when both FIN0 and FIN 270 are logic high and otherwise is logic low.

The NAND gate 114 operates to provide a signal that is representative of the phase difference between input signals FIN180 and FIN90. Specifically, the output of the NAND gate 112 is logic low only when both FIN180 and FIN 90 are logic high and otherwise the output is logic high. Inverter 122 inverts the output of NAND 114 so that signal PerOUT2 is logic high only when both FIN180 and FIN90 are logic high and otherwise is logic low.

The NAND gate 116 operates to provide a signal that is representative of the phase difference between input signals FIN90 and FIN0. Specifically, the output of the NAND gate 117 is logic low only when both FIN90 and FIN0 are logic high and otherwise the output is logic high. Inverter 124 inverts the output of NAND 116 so that signal PerOUT3 is logic high only when both FIN90 and FIN0 are logic high and otherwise is logic low.

Finally, the NAND gate 118 operates to provide a signal that is representative of the phase difference between input signals FIN180 and FIN270. Specifically, the output of the NAND gate 118 is logic low only when both FIN180 and FIN270 are logic high and otherwise the output is logic high. Inverter 126 inverts the output of NAND 118 so that signal PerOUT4 is logic high only when both FIN180 and FIN270 are logic high and otherwise is logic low.

Figure 2:
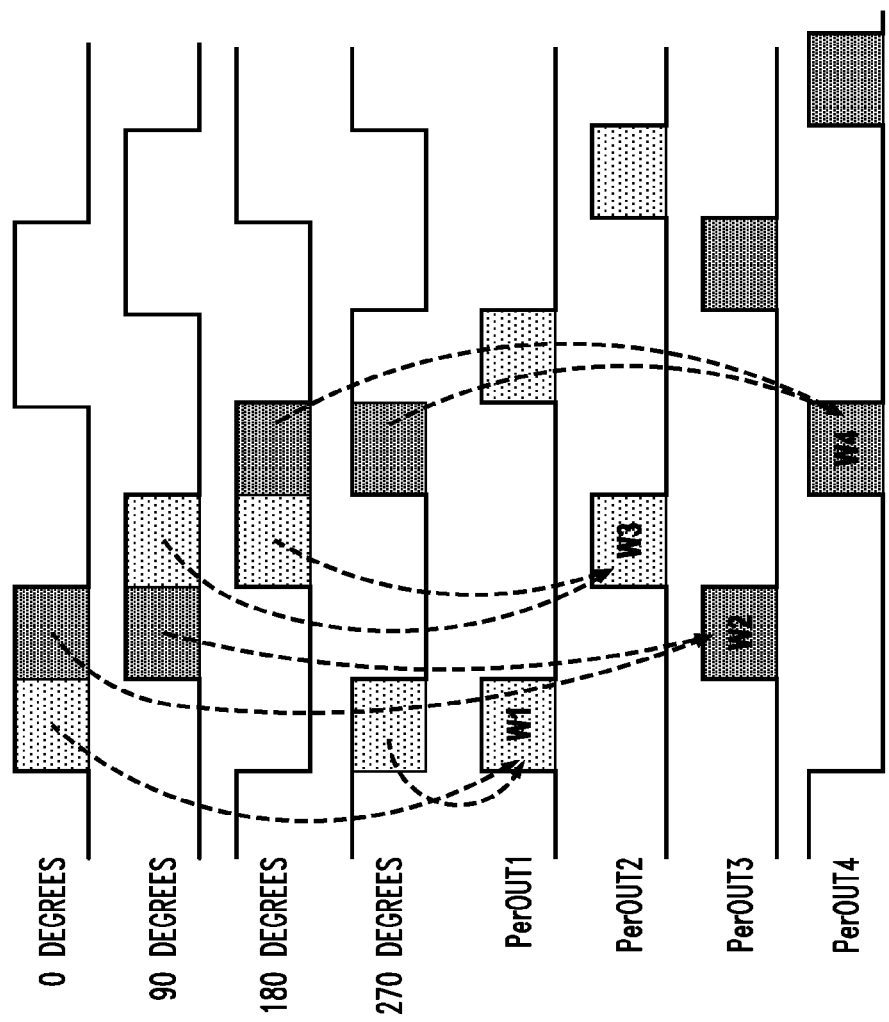
FIG. 2 illustrates the operation of the phase difference-to-period converter portion of the measurement section of the BIST measurement circuit of FIG. 1.

FIG. 2 illustrates the timing of signals PerOUT1, PerOUT2, PerOUT3 and PerOUT4 against one another and against input signals FIN0, FIN90, FIN180 and FIN270, assuming no phase error. As can be seen from FIG. 2, PerOUT1 provides a control pulse W1; PerOUT2 provides control pulse W2; PerOUT3 provides a control pulse W3; and PerOUT4 provides a control pulse W4. Each control pulse in this illustration has a period that is one quarter that of the input signal.

Figure 3:
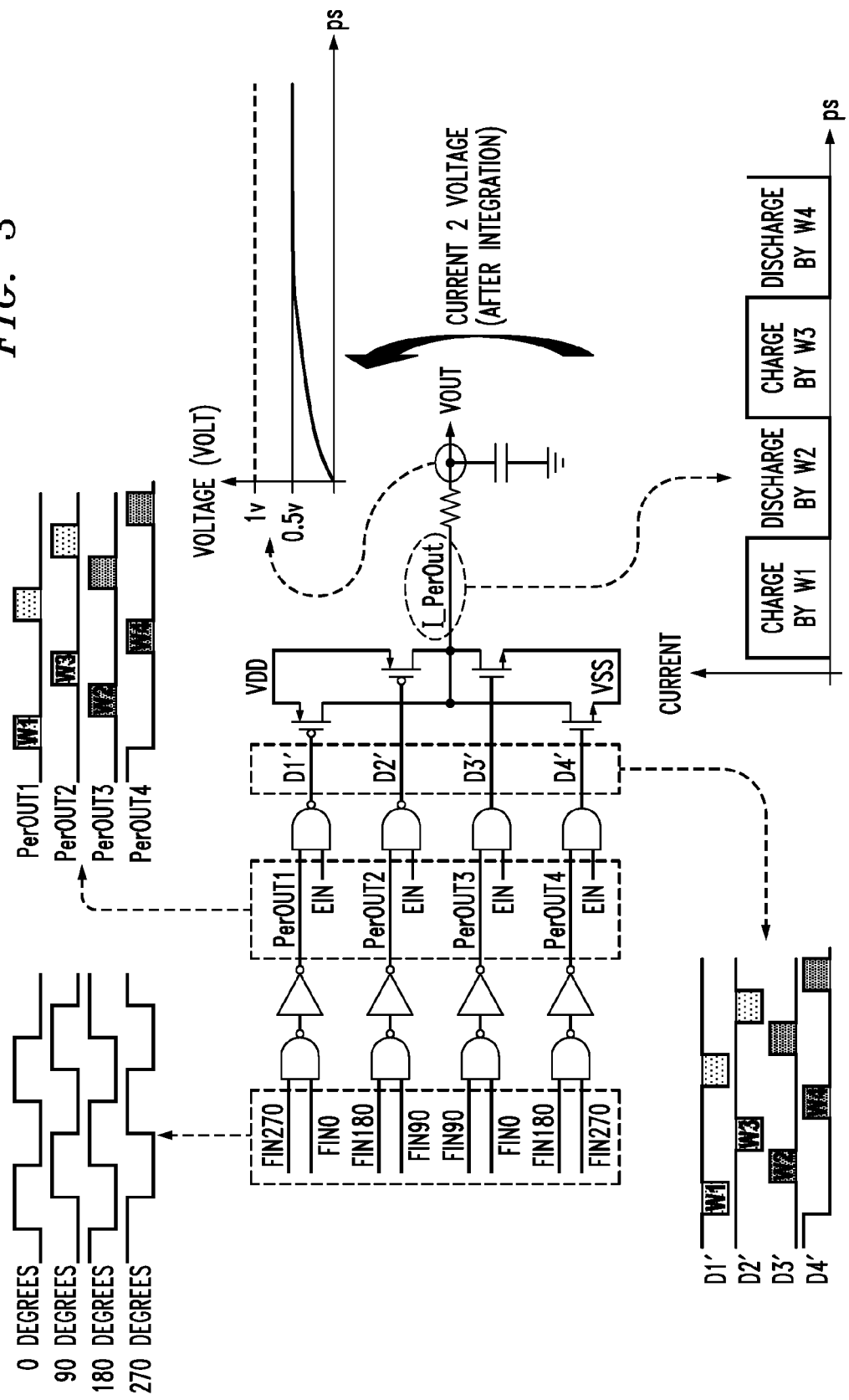
FIG. 3 illustrates the operation of the phase difference measurement section of the BIST measurement circuit of FIG. 1.

The phase-difference-to-period converter circuit 110 also includes NAND gates 128 and 130 and AND gates 132 and 134. Each gate 128, 130, 132 and 134 has an enable input EIN, which is logic high when the phase difference measurement section 105 of the circuit 100 is selected for operation and is logic low when the reference section 160 is selected for operation. In the illustrated embodiment, both sections 105 and 160 are coupled to the same current-to-voltage converter 148 and do not operate at the same time. Other configurations with separate current-to-voltage converters may be used. These gates operate to pass the control signals PerOUT1 to PerOUT4 to the period-to-current converter circuit 136 when EIN is logic high as control signals D1' to D4', respectively, albeit in inverted form in the case of PerOUT1 and PerOUT2 since D1' and D2' are used to control PMOS transistors within the period-to-current converter circuit 136. These waveforms D1' to D4' are shown in FIG. 3.

The phase difference between the signals is provided by the NAND gates 112 to 118 described above, but the outputs PerOUT 1 to PerOUT 4 relate to time, which is not directly measured. Therefore, a circuit is needed to translate the timing into a voltage. This conversion is now described. The period-to-current converter circuit 136 operates to provide combined output current waveform I_PerOut, which has four distinct time slots within a single period corresponding to, in order, pulses W1, W2, W3 and W4. The operation of the period-to-current converter circuit 136 is illustrated in connection with FIG. 4. As shown in both FIGS. 1 and 4, the circuit 136 includes four transistors coupled to node 146, including PMOS transistors 138, 140 and NMOS transistors 142, 144. PMOS transistor 138 is controlled at its gate by signal D1' from phase-difference-to-period converter circuit 110 and has a source terminal coupled to VDD and drain terminal coupled to node 146. PMOS transistor 140 is controlled at its gate by signal D2' from phase-difference-to-period converter circuit 110 and also has a source terminal coupled to VDD and drain terminal coupled to node 146. NMOS transistor 142 is controlled at its gate by signal D3' from phase-difference-to-period converter circuit 110 and has a source terminal coupled to VSS and drain terminal coupled to node 146. Finally, NMOS transistor 144 is controlled at its gate by signal D4' from phase-difference-to-period converter circuit 110 and has a source terminal coupled to VSS and drain terminal coupled to node 146.

Figure 4:
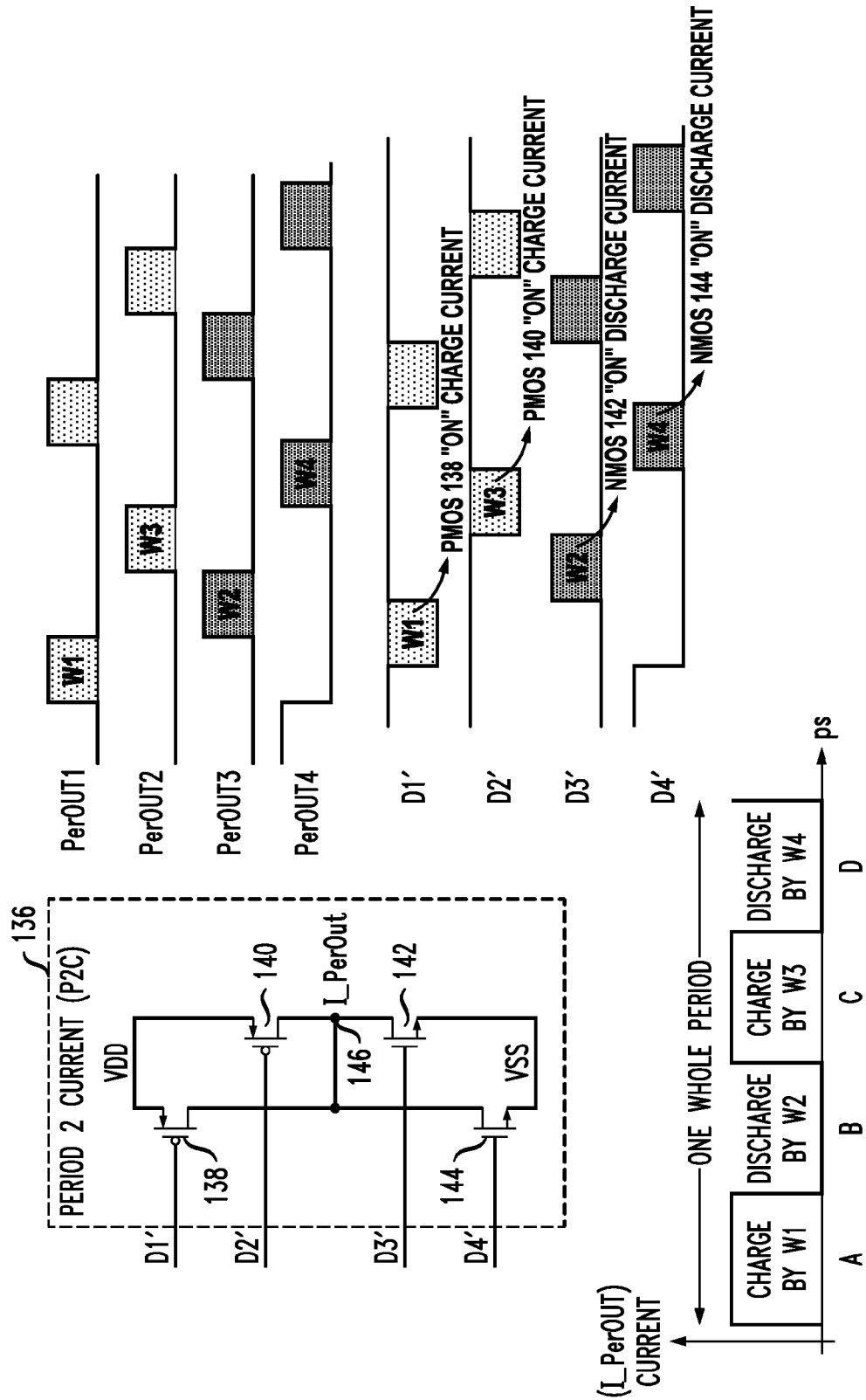
FIG. 4 illustrates the operation of the period-to-current conversion circuit of the BIST measurement circuit of FIG. 1.

As illustrated in FIG. 4, during the first time slot (labeled "A"), while D1' is active (i.e., pulse W1 is present) and D2' to D4' are in active, transistor 138 is on to charge node 146. Transistors 140, 142 and 144 are off. Node 146 charges as long as pulse W1 of D1' is low.

During the second time slot (labeled "B"), while D3' is active (i.e., pulse W2 is present) and D1', D2' and D4' are inactive, transistor 142 is on to discharge node 146. Transistors 138, 140 and 144 are off.

During the third time slot (labeled "C"), while D2' is active (i.e., pulse W3 is present) and D1', D3' and D4' are inactive, transistor 140 is on to charge node 146. Transistors 138, 142 and 144 are off.

Finally, during the fourth time slot (labeled "D"), which D4' is active (i.e., pulse W4 is present) and D1', D2' and D3' are inactive, transistor 144 is on to discharge 146. The combined current waveform is shown in FIGS. 3 and 4 at node 146.

Referring again to FIG. 1, the measurement circuit includes current-to-voltage converter circuit 148 coupled to node 146 to convert current signal I_PerOut provided from period-to-current converter circuit 136 into a voltage waveform, specifically to a DC voltage value. In the illustrated embodiment, the current to voltage converter is a simple integrator, embodied as a simple RC low pass filter including a resistor 150 and a capacitor 152 connected in parallel. FIG. 3 illustrates the operation of the integrator and the resulting waveform. In this illustration, assuming a 1.0V input signal, if the phase error is zero, then the voltage waveform has a value of 0.5V.

Figure 5:
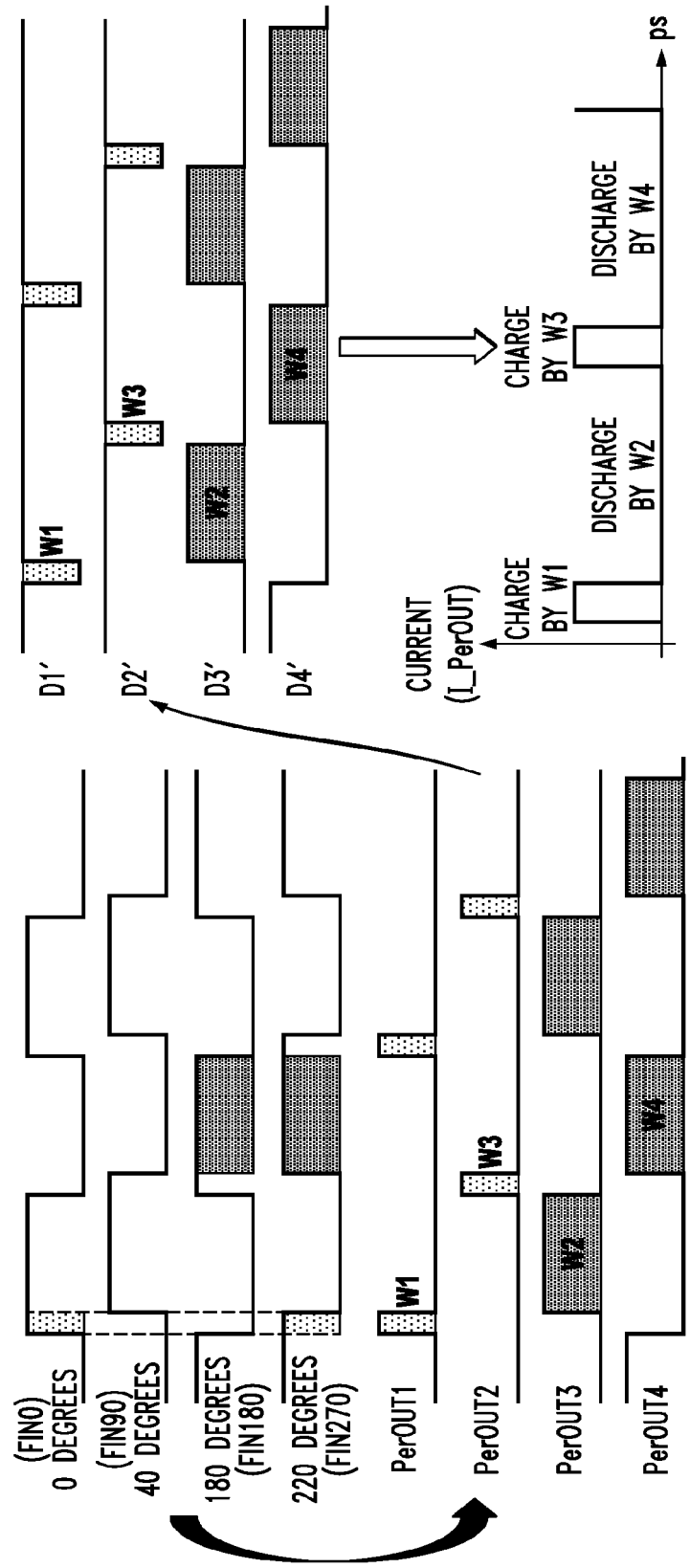
FIG. 5 illustrates the operation of the period-to-current converter circuit of the BIST measurement circuit of FIG. 1 when the delayed clock signal is out of proper phase relationship with the source clock signal.

The preceding discussion illustrated the operation when there was no phase error, i.e., when FIN90 is exactly 90 degrees out of phase with FIN0 (and FIN270 is 90 degrees out of phase with FIN180). FIG. 5 illustrates the operation when there is phase error.

In FIG. 5, the FIN0 and FIN180 signals are in proper phase relationship since they are simply the inverse of one another, i.e., part of the same differential pair. However, the FIN90 signal is only 40 degrees out of phase with FIN0 rather than the desired 90 degrees, which is 50 degrees out of proper phase relationship with FIN0. As such, the FIN 270 signal, which is the inverse of FIN90, was at 220 degrees, which is 50 degrees out of proper phase relationship with FIN0. Since the FIN0 and FIN270 signals (which is at 220 degrees) are both high for only a small period of overlapping time, pulse W1 of PerOUT1 is much smaller than pulse W1 in the example of FIG. 2. Likewise, pulse W3 of PerOUT3 is much smaller than pulse W3 in the example of FIG. 2 since FIN 90 (which is actually 40 degrees) and FIN180 are both high for only a small period of overlapping time. Conversely, both pulses W2 and W4 are longer given the greater overlap times during which FIN0 and FIN90 (which is again actually 40 degrees) are both high and during which FIN180 and FIN270 (which is again at 220 degrees) are both high, respectively. As shown in FIG. 5, this leads to less time "on" for PMOSs 138, 140 and more time "on" for NMOSs 142, 144, which results in less charging and more discharging of current at node 146. The resulting I_PerOut waveform is shown in FIG. 5. Providing this current waveform to the current-to-voltage converter 148 produces a voltage level that is below the 0.5V level that illustrates 90 degree proper phase relationship between FIN0 and FIN90, with the voltage level indicative of the actual phase difference.

Of particular importance, the phase difference-to-period converter circuit 110 of the phase difference measurement circuit section 105 works at a high speed and extracts the phase difference with the four NAND circuits without error due to PVT corner variation. That is, since both clocks FIN0 and FIN90 (and their inversions FIN180 and FIN270) pass through the same type of gates, and these gates have the same PVT corner, any error induced by the PVT corner is canceled out. For example, in the SF corner, the rising time is reduced and the falling time is increased. But PerOUT1 to PerOUT 4 would have the same timing width (in an example of no phase error between FIN0 and FIN90, e.g., in a control situation) since they are affected equally by this process corner.

Returning to FIG. 1, the phase difference measurement circuit 100 includes a reference section 160. The reference section 160 includes a low speed phase-to-period converter circuit 162 that is coupled to a second period-to-converter circuit 172. The output of the second period-to-converter circuit 172 is coupled to node 146, which is the input node to the above-described current-to-voltage converter 148. The reference section 160 is operable only when the phase difference measurement section 105 is not. That is, the reference section is operable when enable control signal EIN is low, and EIN inverse (EINB) is high.

Figure 6:
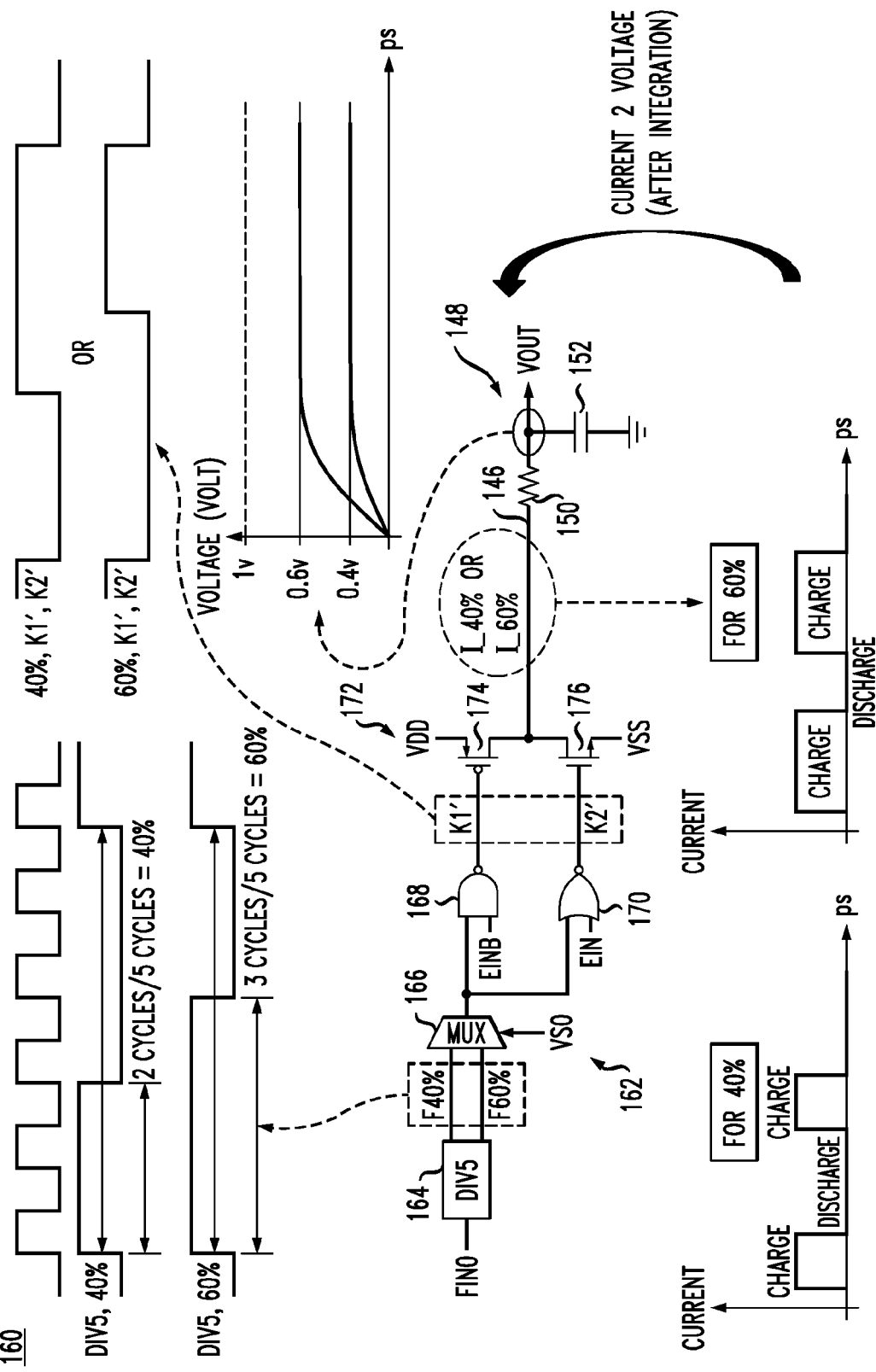
FIG. 6 illustrates the operation of the reference section of the BIST measurement circuit of FIG. 1.

The low speed phase-to-period converter 162 includes a frequency divider circuit 164 that is configured to divide the input clock (FIN0) to lower speed to increase the period width for improving the reference accuracy. In embodiments, the converter 162 is a mod-5 synchronous counter. In the illustrated embodiment, the divider circuit 164 provides a first signal labeled F40% and a second signal labeled F60%. FIG. 6 illustrates these waveforms. The F40% signal (labeled Div5,40%) has a period that is five times longer than the period of FIN0 and a duty cycle that is less than that of the input clock signal, e.g., 40% duty cycle. The F60% signal (labeled Div5,60%) has a period that is also five times longer than the period of FIN0 and a duty cycle that is larger than that of the input clock signal, e.g., 60% duty cycle.

The low speed phase-to-period converter 162 includes a selection circuit, such as MUX circuit 166, which is responsive to reference clock selection control signal VS0. For example, when VS0 is a 0, the MUX circuit 166 outputs the F40% signal and when VS0 is a 1, the MUX circuit 166 outputs the F60% signal. The output of the MUX 166 is connected to the input of a NAND gate 168 and the input of a NOR gate 170. The NAND gate also has control signal EINB as an input and the NOR gate has EIN as an input. The output of the NAND gate 168 is always logic high when EINB is logic low (EIN is logic high), and the output of the NOR gate 170 is always logic low when EIN is logic high (EINB is logic low). This ensures that transistors of the second period-to-current converter 172 are off when the reference section 160 is off and measurement section 105 is on. The NAND gate 168 inverts its clock input and passes it as output K1' when EINB is logical high. That is, output K1' is logic low when both inputs—either F40% or F60% (first input) and EINB (second input)—are logic high and is otherwise logic high. The NOR gate 170 inverts its clock input and passes it as output K2' when EIN is logic low (i.e., when EINB is logic high). That is, assuming EIN is low, then output K2' is logic low when the selected input clock signal—either F40% or F60%—is logic high and is logic high when the selected input clock signal is logic low. These waveforms are shown in FIG. 6.

The second period-to-current converter circuit 172 of the reference circuit 160 is constructed and operates in the same way as the first period-to-current converter circuit 136. That is, when K1' is logic low, PMOS 174 is on to charge node 146, and when K2' is logic high NMOS 176 is on to discharge node 146. Current waveforms for I_40% and 1-60% signals are shown in FIG. 6. When provided to the current-to-voltage converter circuit 148, the period signals are represented as voltage waveforms that approach a DC value.

It should be understood that control signal EIN/EINB is not needed. Rather, in embodiments, two current-to-voltage converter circuit 148 can be provided, one each for the measurement section 105 and the reference section 160. In this embodiment, the NAND gates 128 and 130 can be eliminated and the NAND gates 132 and 134 can be replaced with inverters. Likewise, NAND and NOR gates 168 and 170 can be replaced with inverters.

The main purpose of the reference circuit 160 is as a calibration circuit for the PMOS and NMOS transistors of the period-to-current converter circuit 136. That is, when the PMOS and NMOS transistors vary on the silicon, the reference circuit 160 can be used for calibration. The following examples illustrate this point.

In a first example, assume the output voltage VOUT generated using the reference circuit 160 corresponding to the F40% signal is 0.4V and assume that the output voltage VOUT corresponding to the F60% signal is 0.6V. In this situation, one would expect an output voltage VOUT from the measurement section 105 to be 0.5V if there is no phase error, i.e., if FIN90 is properly 90 degrees out of phase with FIN0.

In a second example, assume the fabricated PMOS transistors are fast and the fabricated NMOS transistors are slow (i.e., the FS corner). Also, assume the output voltage VOUT generated using the reference circuit 160 corresponding to the F40% signal is 0.384V and assume that the output voltage VOUT corresponding to the F60% signal is 0.576V. In this situation, one would expect an output voltage VOUT from the measurement section 105 to be 0.48V, rather than 0.5V, if there is no phase error, i.e., if FIN90 is properly 90 degrees out of phase with FIN0.

Figure 7:
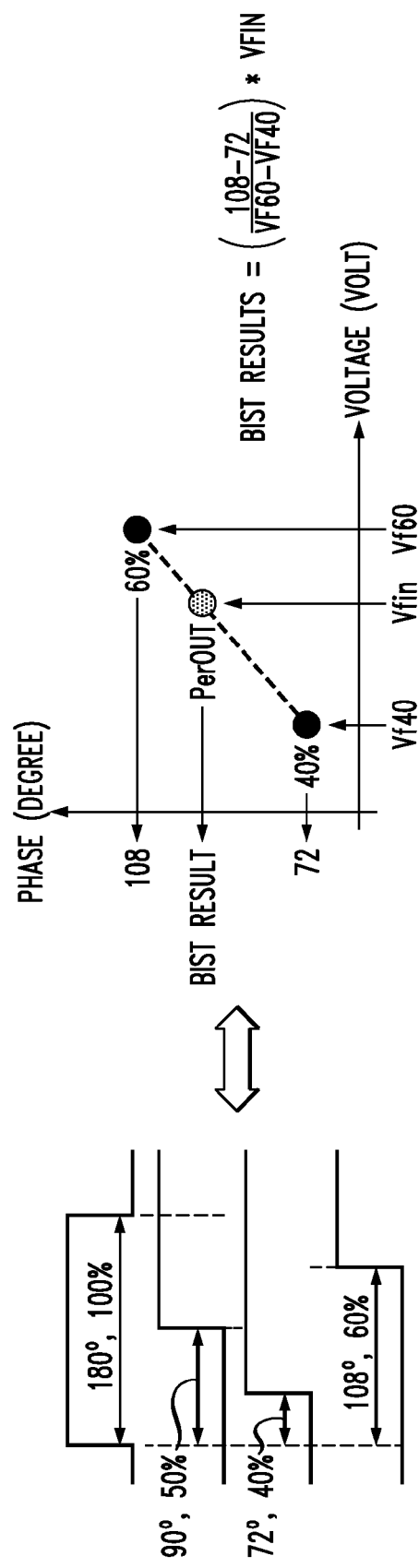
FIG. 7 illustrates a technique for determining the phase difference between the source clock and a phase delayed version of the clock using the outputs of the BIST measurement circuit of FIG. 1.

With reference to FIG. 7, it is known that the 40% signal corresponds to a 72 degree phase difference from FIN0 and that a 60% signal corresponds to a 108 degree phase difference. A linear relationship is assumed between the output voltage VOUT and the phase. The VOUT data points from the reference circuit 160 are used to develop this relationship, from which the output voltage VOUT from the measurement circuit 105 can be used to determine the phase difference between the FIN0 and FIN90. The linear relationship corresponds to the following equation (shown in FIG. 7) for which the phase measurement can be determined: BIST Result= ((108−72)/(VF60−VF40))*VFIN, where VF60 is the VOUT when EIN is low and F40% is selected; VF40 is the VOUT when EIN is low and F60% is selected; and VFIN is the VOUT when EIN is high.

Using the first example above, where VF60 is 0.6V and VF40 is 0.4V, then the equation becomes 180*VFIN. If VFIN is 0.5V, then it is determined that the phase difference is 90 degrees (180*0.5) as hoped for. If VFIN is, rather, 0.48V, then it is determined that the phase difference is 86.4 degrees (180*0.48), meaning there is a negative 3.6 degree phase error in the output of the DLL circuit under test.

Using the second example above, where VF60 is 0.576V and VF40 is 0.384V, then the equation reduces to 187.5*VFIN. If VFIN is 0.48V, then it is determined that the phase difference is 90 degrees (187.5*0.48) as hoped for. If VFIN is, rather, 0.5V, then it is determined that the phase difference is 93.5 degrees (187.5*0.5V), meaning there is a positive 3.5 degree phase error in the output of the DLL circuit.

Figure 8:
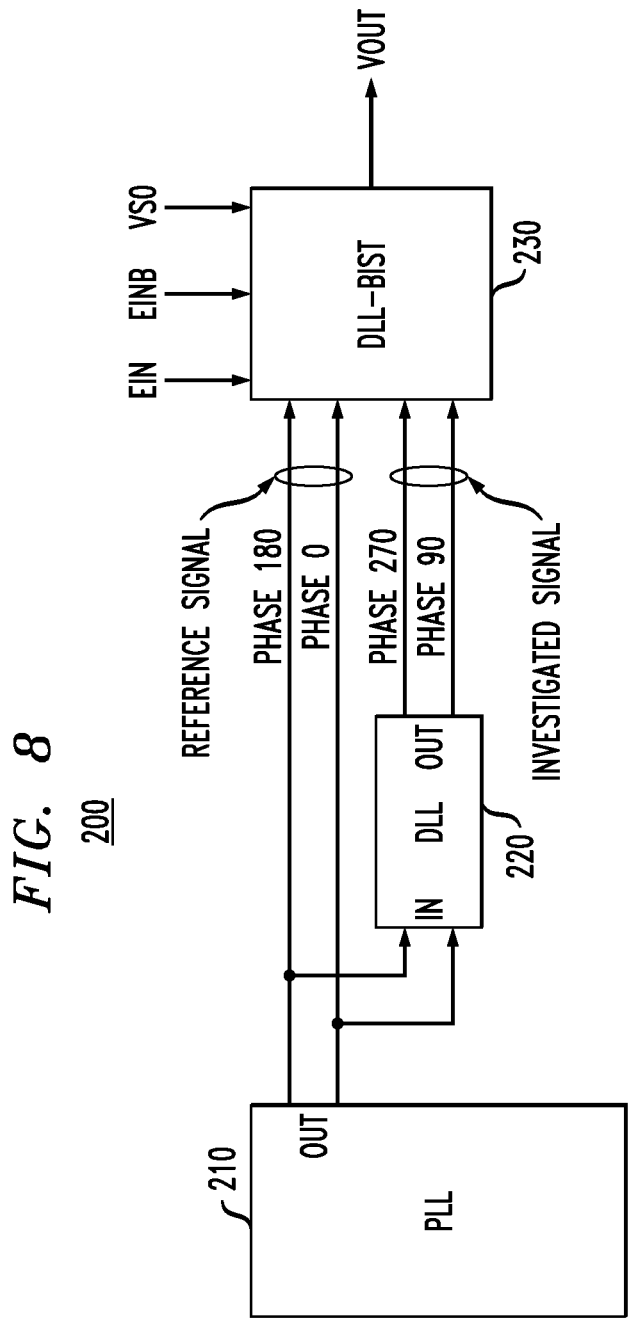
FIG. 8 illustrates a clock system for high frequency IC applications.

FIG. 8 illustrates a clock system 200 that may be part of a high frequency application, e.g., 1 GHz or greater and in embodiments 2 GHz or greater. The clock system 200 may be implemented within any number of different IC chips, such as communication chips, 2.5D/3D integrated circuit chips, and others. The clock system 200 includes a phase-lock-loop circuit 210 that provides differential clock signals represented as Phase 0 and Phase 180 in FIG. 8. The clock system also includes a DLL circuit 220 for providing delayed versions of the differential clock signals represented as Phase 90 and Phase 270 in FIG. 8. The DLL circuit 220 has a pair of differential inputs corresponding to the differential clock signals from the PLL 210 and a pair of differential outputs for providing delayed versions of the differential inputs, i.e., Phase 90 and Phase 270 signals. The clock system 200 also includes a DLL BIST circuit 230 which has inputs corresponding to the Phase 0, Phase 90, Phase 180 and Phase 270 signals and an output VOUT. The DLL-BIST circuit 230 can be measurement circuit 100 of FIG. 1 and has control inputs EIN, EINB and VS0 as described above for selecting between operation of the measurement and reference sections and selecting, when using the reference section, either F40% or F60%.

As noted above, it is important that the measurement circuit perform across varied process corners to provide accurate measurements. It is expected that the measurement results of measurement circuits be within +/−1.5 degrees (2 μs) for a 2 GHz clock signal. Simulations were performed for the measurement circuit described herein, and results are presented below in two tables.

TABLE 1

| Process Corner | Phase Shift (degree) | VFIN (mv) | VF40 (mv) | VF60 (mv) | BIST Result (degree) | Meas. Error (degree) |
|---|---|---|---|---|---|---|
| TT | 90 | 423.29 | 339.13 | 508.91 | 90 | 0 |
| SS | 90 | 426.18 | 339.52 | 509.34 | 90 | 0 |
| FF | 90 | 417.79 | 338.31 | 507.75 | 89 | −1 |
| SF | 90 | 430.56 | 339.66 | 509.26 | 91 | +1 |
| FS | 90 | 417.11 | 338.95 | 508.94 | 89 | −1 |

TABLE 2

| Process Corner | Phase Shift (degree) | VFIN (mv) | VF40 (mv) | VF60 (mv) | BIST Result (degree) | Meas. Error (degree) |
|---|---|---|---|---|---|---|
| TT | 90 | 423.29 | 339.13 | 508.91 | 90 | 0 |
| TT | 92 | 433.63 | 339.12 | 508.9 | 92 | 0 |
| TT | 95 | 447.26 | 339.12 | 508.89 | 95 | 0 |
| TT | 45 | 212.28 | 339.14 | 508.92 | 45 | 0 |
| TT | 135 | 638.33 | 339.18 | 508.91 | 135 | 0 |

The Table 1 results show that all measurements are within +/−1 degree (1.35 ps) across different process corners, which confirms the high accuracy of the measurement circuit. The Table 2 results illustrate that this high accuracy is not phase difference dependent as there is zero mismatch between the input of phase difference and output of BIST across a wide range of phase differences.

A DLL BIST measurement circuit is described herein whose performance is not materially affected by PVT corners. In embodiments, NAND gates are utilized to negate the effects of PVT corners. The measurement circuit can be implemented with a simple construction, including in embodiments four NANDs, six inverters and a RC low pass filter. The real phase difference can be measured based on only three data points, such as the actual measured voltage and two reference voltages generated using reference signals (e.g., the 40% and 60% signals), all with great accuracy for high frequency signals, e.g., +/−1 degree for a 2 GHz clock. The circuit satisfies the need for +/−1.5 degrees of accuracy for a 2 GHz clock across five process corners. The coverage range for the phase detection is also full, from 0 degrees to 180 degrees.

The clock DLL BIST circuit and method described herein can be widely applied in SerDes application, such as in 2.5D Integrated Circuit (IC) applications using a silicon interposer through which mounted ICs communicate. Use of the BIST circuit described herein also saves costs in PCB designs, eliminates the need for a digital scope and requires only an external voltage meter to detect the output value(s) representing the measured phase difference.

In embodiments of a BIST circuit for high speed IC applications described herein, the BIST circuit includes a phase difference detection circuit, a period-to-current conversion circuit having an input coupled to an output of the phase difference detection circuit and a current-to-voltage conversion circuit coupled to an output of the period-to-current conversion circuit. The phase difference detection circuit includes a first NAND logic for receiving as inputs an input clock signal and a delayed version of an inverted version of the input clock signal; a second NAND logic for receiving as inputs the inverted version of the input clock signal and a delayed version of the input clock signal; a third NAND logic for receiving as inputs the input clock signal and the delayed version of the input clock signal; and a fourth NAND logic for receiving as inputs the inverted version of the input clock signal and a delayed version of the inverted version of the input clock signal.

In certain embodiments, the BIST includes a phase difference measurement section responsive to an enable control signal having a phase difference detection circuit, the phase detection circuit comprising first NAND logic for receiving as inputs an input clock signal and a delayed version of an inverted version of the input clock signal; second NAND logic for receiving as inputs the inverted version of the input clock signal and a delayed version of the input clock signal; third NAND logic for receiving as inputs the input clock signal and the delayed version of the input clock signal; and fourth NAND logic for receiving as inputs the inverted version of the input clock signal and a delayed version of the inverted version of the input clock signal; and a period-to-current conversion circuit having first and second PMOS transistors responsive to outputs of the first and second NAND logics for charging an output node of the period-to-current conversion circuit and first and second NMOS transistors responsive to outputs of the third and fourth NAND logic for discharging the output node of the period-to-current conversion circuit. The BIST circuit also includes a current-to-voltage conversion circuit having an input coupled to the output of the period-to-current conversion circuit of the phase difference measurement section; and a reference section responsive to the enable control signal for selectively generating with the current-to-voltage conversion circuit first and second reference voltages for use in calibrating an output of the current-to-voltage conversion circuit.

Embodiments of an integrated circuit device comprising a clock system are also described herein. The clock system includes a clock circuit for generating a pair of differential clock signals; a delay locked loop circuit for generating a pair of delayed differential clock signals corresponding to the pair of differential clock signals from the clock circuit; and a built-in-self-test (BIST) circuit for generating an output voltage signal representing a phase delay between the pair of differential clock signals and the pair of delayed differential clock signals. The BIST circuit includes a phase difference detection circuit comprising a first NAND logic for receiving as inputs a first one of the pair of differential clock signals and a first one of the pair of delayed differential clock signals; a second NAND logic for receiving as inputs a second one of the pair of differential clock signals and a second one of the pair of delayed differential clock signals; a third NAND logic for receiving as inputs the first one of the pair of differential clock signals and the second one of the pair of delayed differential clock signals; and a fourth NAND logic for receiving as inputs the second one of the pair of differential clock signals and the first one of the pair of delayed differential clock signals; a period-to-current conversion circuit having first and second PMOS transistors responsive to outputs of the first and second NAND logics for charging an output node of the period-to-current conversion circuit and first and second NMOS transistors responsive to outputs of the third and fourth NAND logics for discharging the output node of the period-to-current conversion circuit; and a current-to-voltage conversion circuit having an input coupled to the output of the period-to-current conversion circuit.

Although the measurement circuits and techniques have been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A built-in-self-test (BIST) circuit for high speed IC applications, comprising:
    a phase difference detection circuit;
    a period-to-current conversion circuit having an input coupled to an output of the phase difference detection circuit; and
    a current-to-voltage conversion circuit coupled to an output of the period-to-current conversion circuit,
    wherein the phase difference detection circuit comprises:
        a first NAND logic gate for receiving as inputs an input clock signal and a delayed version of an inverted version of the input clock signal;
        a second NAND logic gate for receiving as inputs the inverted version of the input clock signal and a delayed version of the input clock signal;
        a third NAND logic gate for receiving as inputs the input clock signal and the delayed version of the input clock signal; and
        a fourth NAND logic gate for receiving as inputs the inverted version of the input clock signal and the delayed version of the inverted version of the input clock signal,
    wherein the period-to-current conversion circuit comprises:
        a first PMOS transistor coupled between a high power supply node and the period-to-current conversion circuit output and being responsive to an output of the first NAND logic gate;
        a second PMOS transistor coupled between the high power supply node and the period-to-current conversion circuit output and being responsive to an output of the second NAND logic gate;
        a first NMOS transistor coupled between a low power supply node and the period-to-current conversion circuit output and being responsive to an output of the third NAND logic gate; and
        a second NMOS transistor coupled between the low power supply node and the period-to-current conversion circuit output and being responsive to an output of the fourth NAND logic gate,
    wherein the phase difference detection circuit is configured to turn the first and second NMOS transistors and first and second PMOS transistors off responsive to an enable control signal.

2. The BIST circuit of claim 1, wherein the phase difference detection circuit is configured to invert the outputs of the third and fourth NAND logic gates before coupling those outputs to the first and second NMOS transistors, respectively.

3. The BIST circuit of claim 1, wherein the phase difference detection circuit further comprises:
    first, second, third and fourth inverters coupled to the outputs of the first, second, third and fourth NAND logic gates;
    a fifth NAND logic gate having a first input coupled to an output of the first inverter, a second input coupled to the enable control signal, and an output coupled to a gate of the first PMOS transistor;
    a sixth NAND logic gate having a first input coupled to an output of the second inverter, a second input coupled to the enable control signal, and an output coupled to a gate of the second PMOS transistor;
    a first AND logic gate having a first input coupled to an output of the third inverter, a second input coupled to the enable control signal, and an output coupled to a gate of the first NMOS transistor; and
    a second AND logic gate having a first input coupled to an output of the fourth inverter, a second input coupled to the enable control signal, and an output coupled to a gate of the second NMOS transistor.

4. The BIST circuit of claim 3, wherein the current-to-voltage conversion circuit comprises an integrator.

5. The BIST circuit of claim 1, further comprising a reference section coupled to the current-to-voltage conversion circuit for selectively generating first and second reference voltages for use in calibrating an output of the current-to-voltage conversion circuit.

6. The BIST circuit of claim 5, wherein the reference section comprises:
    a frequency divider circuit operable to provide, from the input clock signal, a first reference clock signal at a lower frequency than the input clock signal and having a reduced duty cycle and a second reference clock signal at the lower frequency and having an increased duty cycle; and
    a second period-to-current conversion circuit, the second period-to-current conversion circuit comprising:
        a PMOS transistor coupled between a high power supply node and an input to the current-to-voltage conversion circuit and being responsive to a selected one of the first and second reference clock signals; and
        a NMOS transistor coupled between a low power supply node and the input to the current-to-voltage conversion circuit and being responsive to the selected one of the first and second reference clock signals.

7. The BIST circuit of claim 6, wherein the reference section further comprises:

a selection circuit responsive to a reference clock selection control signal for providing the selected one of the first and second reference clock signals;

a fifth NAND logic gate having a first input coupled to an output of the selection circuit, a second input for receiving a reference section enable control signal, and an output coupled to a gate of the PMOS transistor; and a NOR logic gate having a first input coupled to the output of the selection circuit, a second input for receiving an inverted reference section enable control signal, and an output coupled to a gate of the NMOS transistor.

8. The BIST circuit of claim 7, wherein the reference section is configured to turn the PMOS and NMOS transistors off responsive to the reference section enable control signal.

9. A built-in-self-test (BIST) circuit for high speed IC applications, comprising:

a phase difference measurement section responsive to an enable control signal, comprising:

a phase difference detection circuit, the phase detection circuit comprising first NAND logic gate for receiving as inputs an input clock signal and a delayed version of an inverted version of the input clock signal; second NAND logic gate for receiving as inputs the inverted version of the input clock signal and a delayed version of the input clock signal; third NAND logic gate for receiving as inputs the input clock signal and the delayed version of the input clock signal; and fourth NAND logic gate for receiving as inputs the inverted version of the input clock signal and the delayed version of the inverted version of the input clock signal;

a period-to-current conversion circuit having first and second PMOS transistors responsive to outputs of the first and second NAND logic gates for charging an output node of the period-to-current conversion circuit and first and second NMOS transistors responsive to outputs of the third and fourth NAND logic gate for discharging the output node of the period-to-current conversion circuit; and a current-to-voltage conversion circuit having an input coupled to the output of the period-to-current conversion circuit of the phase difference measurement section; and a reference section responsive to the enable control signal for selectively generating with the current-to-voltage conversion circuit first and second reference voltages for use in calibrating an output of the current-to-voltage conversion circuit, wherein the phase difference measurement section is configured to turn the first and second PMOS transistors and first and second NMOS transistors off when the enable control signal represents selection of the reference section for operation with the current-to-voltage conversion circuit.

10. The BIST circuit of claim 9, wherein the phase difference detection circuit of the phase difference measurement section further comprises:

first, second, third and fourth inverters coupled to the outputs of the first, second, third and fourth NAND logic gates;

a fifth NAND logic gate having a first input coupled to an output of the first inverter, a second input coupled to the enable control signal, and an output coupled to a gate of the first PMOS transistor;

a sixth NAND logic gate having a first input coupled to an output of the second inverter, a second input coupled to the enable control signal, and an output coupled to a gate of the second PMOS transistor;

a first AND logic gate having a first input coupled to an output of the third inverter, a second input coupled to the enable control signal, and an output coupled to a gate of the first NMOS transistor; and a second AND logic gate having a first input coupled to an output of the fourth inverter, a second input coupled to the enable control signal, and an output coupled to the gate of the second NMOS transistor.

11. The BIST circuit of claim 10, wherein the reference section comprises:

a frequency divider circuit operable to provide, from the input clock signal, a first reference clock signal at a lower frequency than the input clock signal and having a reduced duty cycle and a second reference clock signal at the lower frequency and having an increased duty cycle; and a second period-to-current conversion circuit, the second period-to-current conversion circuit comprising:

an output node coupled to the input of the current-to-voltage conversion circuit;

a third PMOS transistor responsive to a selected one of the first and second reference clock signals for charging the output node of the second period-to-current conversion circuit; and a third NMOS transistor responsive to the selected one of the first and second reference clock signals for discharging the output node of the second period-to-current conversion circuit, wherein the reference section is configured to turn the third PMOS and NMOS transistors off when the enable control signal represents selection of the phase difference measurement section for operation.

12. The BIST circuit of claim 11, wherein the reference section further comprises:

a selection circuit responsive to a reference clock selection control signal for selecting between the first and second reference clock signals;

a fifth NAND logic gate having a first input coupled to an output of the selection circuit, a second input for receiving an inverted enable control signal, and an output coupled to the gate of the third PMOS transistor; and a NOR logic gate having a first input coupled to the output of the selection circuit, a second input for receiving the enable control signal, and an output coupled to the gate of the third NMOS transistor.

13. An integrated circuit device comprising a clock system, the clock system comprising:

a clock circuit for generating a pair of differential clock signals;

a delay locked loop circuit for generating a pair of delayed differential clock signals corresponding to the pair of differential clock signals from the clock circuit; and a built-in-self-test (BIST) circuit for generating an output voltage signal representing a phase delay between the pair of differential clock signals and the pair of delayed differential clock signals, the BIST circuit comprising:

a phase difference detection circuit comprising a first NAND logic gate for receiving as inputs a first one of the pair of differential clock signals and a first one of the pair of delayed differential clock signals; a second NAND logic gate for receiving as inputs a second one of the pair of differential clock signals and a second one of the pair of delayed differential clock signals; a third NAND logic gate for receiving as inputs the first one of the pair of differential clock signals and the second one of the pair of delayed differential clock signals; and a fourth NAND logic gate for receiving as inputs the second one of the pair of differential clock signals and the first one of the pair of delayed differential clock signals;

a period-to-current conversion circuit having first and second PMOS transistors responsive to outputs of the first and second NAND logic gates for charging an output node of the period-to-current conversion circuit and first and second NMOS transistors responsive to outputs of the third and fourth NAND logic gates for discharging the output node of the period-to-current conversion circuit; and a current-to-voltage conversion circuit having an input coupled to the output of the period-to-current conversion circuit, wherein the BIST circuit further comprises a reference section for selectively generating with the current-to-voltage conversion circuit first and second reference voltages for use in calibrating an output of the current-to-voltage conversion circuit, and wherein the phase difference measurement section is configured to turn the first and second PMOS transistors and first and second NMOS transistors off when an enable control signal represents selection of the reference section for operation.

14. The integrated circuit device of claim 13, wherein the reference section comprises:

a frequency divider circuit operable to provide, from the input clock signal, a first reference clock signal at a lower frequency than the input clock signal and having a selected reduced duty cycle and a second reference clock signal at the lower frequency and having a selected increased duty cycle;

a selection circuit responsive to a reference clock selection control signal for selecting between the first and second reference clock signals;

a second period-to-current conversion circuit, the second period-to-current conversion circuit comprising:

an output node coupled to the input of the current-to-voltage conversion circuit;

a third PMOS transistor responsive to a selected one of the first and second reference clock signals for charging the output node of the second period-to-current conversion circuit; and a third NMOS transistor responsive to the selected one of the first and second reference clock signals for discharging the output node of the second period-to-current conversion circuit, wherein the reference section is configured to turn the third PMOS and NMOS transistors off when the enable control signal represents the reference section is not selected for operation.

15. The integrated circuit device of claim 13, wherein the current-to-voltage conversion circuit comprises a RC low pass filter circuit.

16. A built-in-self-test (BIST) circuit for high speed IC applications, comprising:

a phase difference detection circuit;

a period-to-current conversion circuit having an input coupled to an output of the phase difference detection circuit; and a current-to-voltage conversion circuit coupled to an output of the period-to-current conversion circuit, wherein the phase difference detection circuit comprises:

a first NAND logic gate for receiving as inputs an input clock signal and a delayed version of an inverted version of the input clock signal;

a second NAND logic gate for receiving as inputs the inverted version of the input clock signal and a delayed version of the input clock signal;

a third NAND logic gate for receiving as inputs the input clock signal and the delayed version of the input clock signal; and a fourth NAND logic gate for receiving as inputs the inverted version of the input clock signal and the delayed version of the inverted version of the input clock signal, wherein the period-to-current conversion circuit comprises:

a first PMOS transistor coupled between a high power supply node and the period-to-current conversion circuit output and being responsive to an output of the first NAND logic gate;

a second PMOS transistor coupled between the high power supply node and the period-to-current conversion circuit output and being responsive to an output of the second NAND logic gate;

a first NMOS transistor coupled between a low power supply node and the period-to-current conversion circuit output and being responsive to an output of the third NAND logic gate; and a second NMOS transistor coupled between the low power supply node and the period-to-current conversion circuit output and being responsive to an output of the fourth NAND logic gate, wherein the phase difference detection circuit further comprises:

first, second, third and fourth inverters coupled to the outputs of the first, second, third and fourth NAND logic gates;

a fifth NAND logic gate having a first input coupled to an output of the first inverter, a second input coupled to a measurement circuit enable control signal, and an output coupled to a gate of the first PMOS transistor;

a sixth NAND logic gate having a first input coupled to an output of the second inverter, a second input coupled to the measurement circuit enable control signal, and an output coupled to a gate of the second PMOS transistor;

a first AND logic gate having a first input coupled to an output of the third inverter, a second input coupled to the measurement circuit enable control signal, and an output coupled to a gate of the first NMOS transistor; and a second AND logic gate having a first input coupled to an output of the fourth inverter, a second input coupled to the measurement circuit enable control signal, and an output coupled to a gate of the second NMOS transistor.

17. A built-in-self-test (BIST) circuit for high speed IC applications, comprising:

a phase difference detection circuit;

a period-to-current conversion circuit having an input coupled to an output of the phase difference detection circuit; and a current-to-voltage conversion circuit coupled to an output of the period-to-current conversion circuit, wherein the phase difference detection circuit comprises:

a first NAND logic gate for receiving as inputs an input clock signal and a delayed version of an inverted version of the input clock signal;

a second NAND logic gate for receiving as inputs the inverted version of the input clock signal and a delayed version of the input clock signal;

a third NAND logic gate for receiving as inputs the input clock signal and the delayed version of the input clock signal; and a fourth NAND logic gate for receiving as inputs the inverted version of the input clock signal and the delayed version of the inverted version of the input clock signal, wherein the BIST circuit further comprises a reference section coupled to the current-to-voltage conversion circuit for selectively generating first and second reference voltages for use in calibrating an output of the current-to-voltage conversion circuit, the reference section comprising:

a frequency divider circuit operable to provide, from the input clock signal, a first reference clock signal at a lower frequency than the input clock signal and having a reduced duty cycle and a second reference clock signal at the lower frequency and having an increased duty cycle; and a second period-to-current conversion circuit, the second period-to-current conversion circuit comprising:

a PMOS transistor coupled between a high power supply node and an input to the current-to-voltage conversion circuit and being responsive to a selected one of the first and second reference clock signals; and a NMOS transistor coupled between a low power supply node and the input to the current-to-voltage conversion circuit and being responsive to the selected one of the first and second reference clock signals.

* * * * *